(12) United States Patent
Lu et al.

(10) Patent No.: US 7,315,117 B2
(45) Date of Patent: *Jan. 1, 2008

(54) FULL COLOR DISPLAY PANEL AND COLOR-SEPARATING SUBSTRATE THEREOF

(75) Inventors: Tien Rong Lu, Tainan (TW); Chi-Chung Chen, Hukou Township, Hsinchu County (TW); Chi-Chih Liao, Taipei (TW)

(73) Assignee: RiTdisplay Corporation, Hsinchu (TW)

( * ) Notice: Subject to any disclaimer, the term of this patent is extended or adjusted under 35 U.S.C. 154(b) by 128 days.

This patent is subject to a terminal disclaimer.

(21) Appl. No.: 10/856,818

(22) Filed: Jun. 1, 2004

(65) Prior Publication Data

US 2004/0245921 A1    Dec. 9, 2004

(30) Foreign Application Priority Data

Jun. 3, 2003    (TW)  ............................ 92115148 A

(51) Int. Cl.
*H01J 1/62*    (2006.01)
*H01J 63/04*    (2006.01)

(52) U.S. Cl. .................. 313/504; 313/506; 313/512; 428/690; 428/917

(58) Field of Classification Search ............... 313/504
See application file for complete search history.

(56) References Cited

U.S. PATENT DOCUMENTS

| | | | | | |
|---|---|---|---|---|---|
| 5,294,870 | A | * | 3/1994 | Tang et al. ................. | 313/504 |
| 5,909,081 | A | * | 6/1999 | Eida et al. .................. | 313/504 |
| 6,008,578 | A | * | 12/1999 | Chen .......................... | 313/500 |
| 6,072,450 | A | * | 6/2000 | Yamada et al. ............. | 313/504 |
| 6,280,559 | B1 | * | 8/2001 | Terada et al. ............... | 313/505 |
| 6,344,712 | B1 | * | 2/2002 | Eida et al. .................. | 313/504 |
| 6,464,898 | B1 | * | 10/2002 | Tomoike et al. ............ | 313/501 |
| 6,559,604 | B2 | * | 5/2003 | Lu et al. ..................... | 313/506 |
| 7,057,341 | B2 | * | 6/2006 | Chen et al. ................. | 313/506 |
| 7,067,975 | B2 | * | 6/2006 | Chen et al. ................. | 313/506 |
| 2002/0000296 | A1 | * | 1/2002 | Terada et al. ............... | 156/295 |
| 2003/0222576 | A1 | * | 12/2003 | Lu .............................. | 313/504 |
| 2003/0222577 | A1 | * | 12/2003 | Lu .............................. | 313/504 |

* cited by examiner

*Primary Examiner*—Sikha Roy
*Assistant Examiner*—Natalie K. Walford
(74) *Attorney, Agent, or Firm*—Jianq Chyun IP Office

(57) ABSTRACT

A full color display panel comprises an organic light-emitting area, a white-light producing layer, a color-separating layer and a transparent substrate. In this case, the organic light-emitting area comprises a plurality of pixels for emitting short wavelength light. The color-separating layer is doped with a fluorescent material and/or a phosphorescent material in a transparent protecting medium. The color-separating layer comprises a light-shielding frame and a plurality of color filters. The light-shielding frame is disposed around the peripheral of the color filters. The color-separating layer is disposed on the transparent substrate. The white-light producing layer is disposed above the color-separating layer. The organic light-emitting area is disposed above the white-light producing layer.

20 Claims, 5 Drawing Sheets

FULL COLOR DISPLAY PANEL AND COLOR-SEPARATING SUBSTRATE THEREOF

This Non-provisional application claims priority under 35 U.S.C. § 119(a) on PATENT Application No(s). 092115148 filed in Taiwan on Jun. 3, 2003, the entire contents of which are hereby incorporated by reference.

BACKGROUND OF THE INVENTION

1. Field of Invention

The invention relates to a full color display panel and a color-separating substrate and, in particular, to a full color display panel and a color-separating substrate comprising a white-light producing layer.

2. Related Art

The colorizing technologies utilized in the present organic electroluminescent displays mainly include the following three. The first technology is "Three Primary Colors Light-emitting Method" that uses respectively three primary colors (Red, Green, and Blue) for an independent electroluminescent unit. The second technology is "Color Conversion Medium" that includes a blue light material and cooperates with a red organic fluorescent material and a green organic fluorescent material to generate various colors. The third technology is "Color Filter Method" that includes white light electroluminescent layer and color filters. Hereinafter, the color conversion medium technology is taken for an example and is described below.

Idemitsu Kosan Co. is one of the leaders in developing the color conversion medium technology. As shown in FIG. 1, a full color display panel 3 comprises an organic light-emitting area 31, a planarization layer 32, a color conversion layer 33, a glass substrate 34 and an encapsulating cap 35. The organic light-emitting area 31 is disposed on the planarization layer 32, the planarization layer 32 is disposed on the color conversion layer 33, the color conversion layer 33 is disposed on the glass substrate 34, and the encapsulating cap 35 is connected to the glass substrate 34. In this case, the organic light-emitting area 31 includes a first electrode 311, an organic functional layer 312 and the second electrode 313, which are disposed on the planarization layer 32 in sequence. The organic functional layer 312 is made of a white light material, so that the organic light-emitting area 31 can emit white light. The color conversion layer 33 comprises a plurality of blue filters 331, green filters 332, red filters 333, blue conversion films 331', green conversion films 332', and red conversion films 333'. The blue conversion films 331', the green conversion films 332' and the red conversion films 333' are disposed on the blue filters 331, the green filters 332 and the red filters 333 respectively. The filters 331, 332, and 333 are respectively corresponding to the pixels of the organic light-emitting area 31.

The white light emitted from the organic light-emitting area 31 may pass through the blue conversion film 331', green conversion film 332' and red conversion film 333', and is respectively converted into blue light, green light and red light. The blue light, green light and red light converted from the white light pass the blue filter 331, green filter 332 and the red filter 333 respectively, to increase the contrast of the blue light, the green light and the red light. Finally, a driving circuit is provided to produce the desired full color screen according to the generated three primary colors (red light (R), green light (G), and blue light (B)).

In the conventional full color display panel 3, however, since at least three photolithography processes are necessary to form the blue conversion films 331', the green conversion films 332' and the red conversion films 333' on the blue filters 331, the green filters 332 and the red filters 333, the manufacturing processes of the full color display panel 3 are more complex and the cost thereof is increased. Furthermore, since the full color display panel 3 includes the planarization layer 32 to make the whole panel more planar, the thickness of the whole panel 3 is also increased, which did not follow the trend toward lightweight and compact devices.

It is therefore a target to provide a full color display panel and a color-separating substrate thereof to solve the above-mentioned problems.

SUMMARY OF THE INVENTION

In view of the foregoing, the invention is to provide a full color display panel and a color-separating substrate thereof, which are without the conventional planarization layer and do not respectively utilize the color conversion films of three primary colors (R, G, B).

To achieve the above, the full color display panel of the invention comprises an organic light-emitting area, a white-light producing layer, a color-separating layer and a transparent substrate. In this invention, the organic light-emitting area includes a plurality of pixels for emitting short wavelength light. The white-light producing layer includes a protecting medium, which is transparent and is doped with a fluorescent material and/or a phosphorescent material. The color-separating layer includes a light-shielding frame and a plurality of color filters, wherein the light-shielding frame is disposed around the peripheral of the color filters. The color-separating layer is disposed on the transparent substrate. The white-light producing layer is disposed above the color-separating layer. The organic light-emitting area is disposed above the white-light producing layer.

To achieve the above, a color-separating substrate of the invention comprises a white-light producing layer, a color-separating layer and a transparent substrate. In this invention, the white-light producing layer includes a protecting medium, which is transparent and is doped with a fluorescent material and/or a phosphorescent material. The color-separating layer includes a light-shielding frame and a plurality of color filters, wherein the light-shielding frame is disposed around the peripheral of the color filters. The color-separating layer is disposed on the transparent substrate. The white-light producing layer is disposed above the color-separating layer.

As mentioned above, the full color display panel and color-separating substrate thereof of the invention has a white-light producing layer, which is used to translate the short wavelength ultraviolet or blue light into white light and to enhance the luminescent efficiency of the organic light-emitting area. Therefore, the white light with uniform and broadband radiation spectrum can be obtained, and satisfy the application of full color displays. Comparing with the conventional art, since the planarization layer is unnecessary in the invention, the structure of the full color display panel of the invention is simplified. At the meanwhile, the thickness of the panel of the invention is reduced. In addition, since it is unnecessary to perform the photolithography processes to form the color conversion films of three primary colors (R, G, B), the manufacturing processes of the full color display panel are simplified and the cost thereof is decreased, and the manufacturing yield is increased. Furthermore, since it is not to be restricted by the areas of the color conversion films, the viewing angle of the panel can be increased.

BRIEF DESCRIPTION OF THE DRAWINGS

The invention will become more fully understood from the detailed description given hereinbelow illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
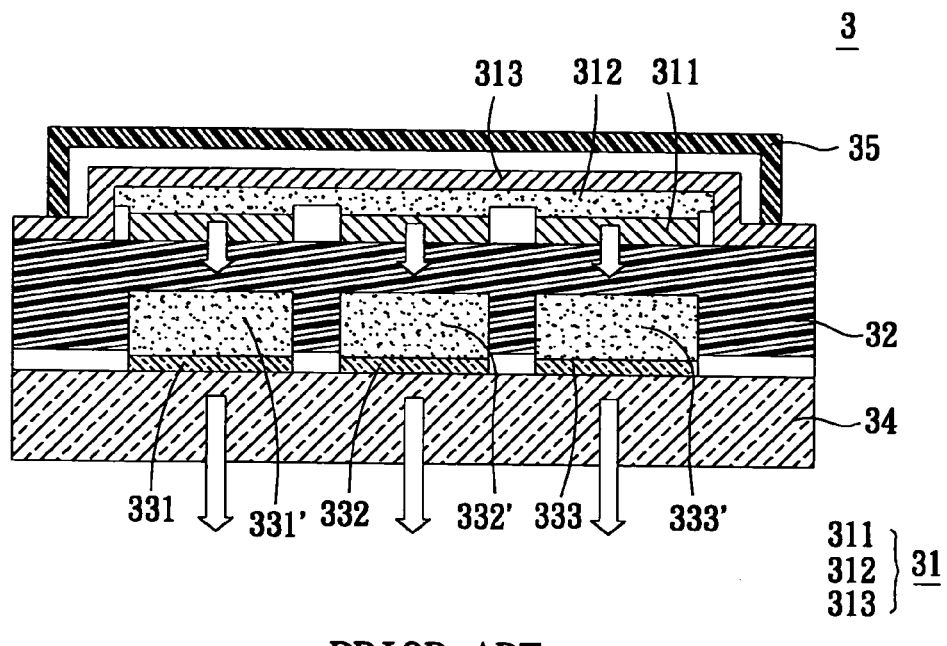
FIG. 1 is a schematic view showing the conventional full color display panel.
Figure 2:
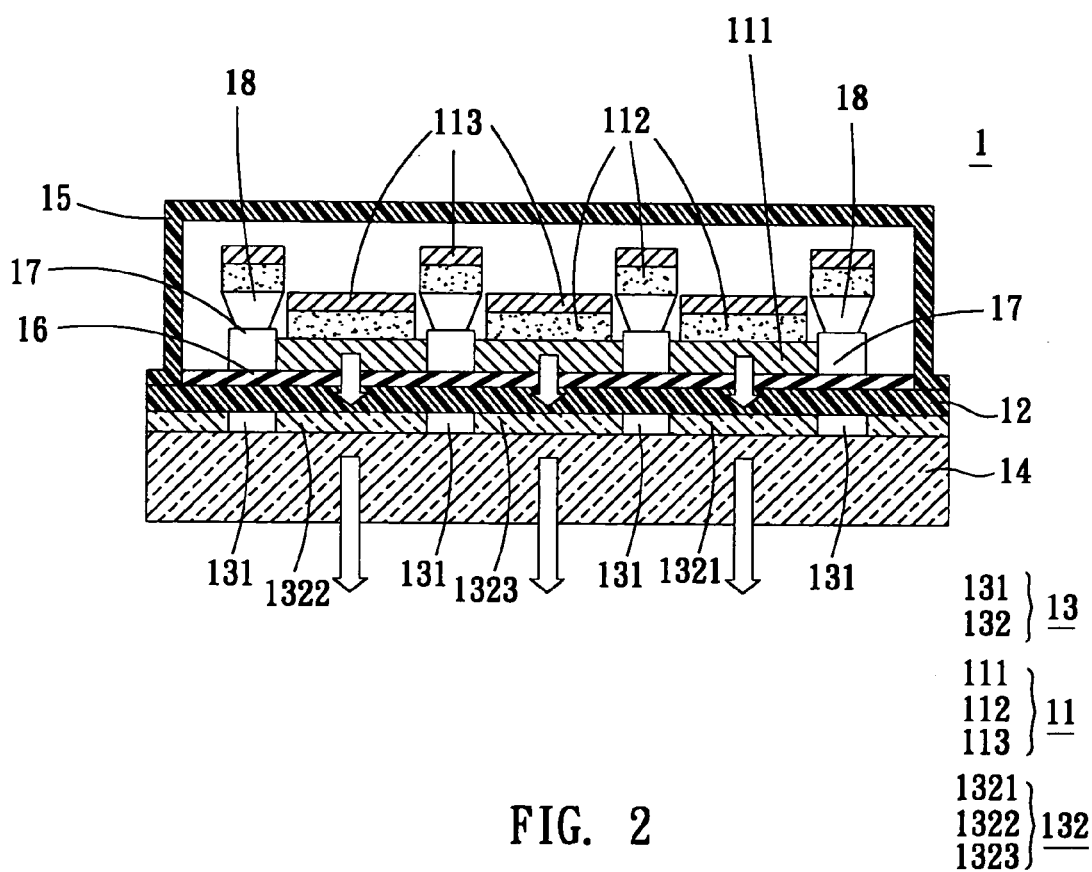
FIG. 2 is a schematic view showing a full color display panel according to a first embodiment of the invention.

With reference to FIG. 2, a full color display panel 1 according to the first embodiment of the invention comprises an organic light-emitting area 11, a white-light producing layer 12, a color-separating layer 13 and a transparent substrate 14. In this embodiment, the organic light-emitting area 11 comprises a plurality of pixels for emitting short wavelength light. The white-light producing layer 12 comprises a protecting medium, which is transparent and is doped with a fluorescent material and/or a phosphorescent material. The color-separating layer 13 comprises a light-shielding frame 131 and a plurality of color filters 132. The light-shielding frame 131 is disposed around the peripheral of the color filters 132. The color-separating layer 13 is disposed on the transparent substrate 14. The white-light producing layer 12 is disposed above the color-separating layer 13. The organic light-emitting area 11 is disposed above the white-light producing layer 12.

As shown in FIG. 2, the organic light-emitting area 11 comprises a plurality of pixels for emitting short wavelength light. The pixel comprises a first electrode 111, an organic functional layer 112, and a second electrode 113. The first electrode 111 is disposed above the white-light producing layer 12. The second electrode 113 is disposed above the first electrode 111, and the organic functional layer 112 is sandwiched between the first electrode 111 and the second electrode 113.

In such a case, the first electrode 111 is formed above the white-light producing layer 12 by a sputtering method or an ion plating method. The first electrode 111 is usually used as an anode and made of a transparent conductive metal oxide, such as indium-tin oxide (ITO), aluminum-zinc oxide (AZO), or indium-zinc oxide (IZO).

The organic functional layer 112 in the current embodiment is disposed on the first electrode 111. The organic functional layer 112 usually may contain a hole injection layer, a hole transporting layer, an electroluminescent layer, an electron transporting layer, and an electron injection layer (not shown). The hole injection layer comprises copper phthalocyanine (CuPc), the hole transporting layer comprises 4,4'-bis[N-(1-naphthyl)-N-phenylamino]biphenyl (NPB), the electron injection layer comprises lithium fluoride (LiF), and the electron transporting layer comprises tris(8-quinolinato-N1,O8)-aluminum (Alq). Each layer of the organic functional layer 112 may be formed upon the first electrode by utilizing evaporation, spin coating, ink jet printing, or printing. Herein, the light emitted from the organic functional layer 112 is short wavelength light such as ultraviolet light or blue light.

The second electrode 113 is disposed on the organic functional layer 112. Herein, the second electrode 113 is formed on the organic functional layer 112 by way of evaporation or sputtering. The material of the second electrode 113 can be aluminum, calcium, and magnesium-silver alloys. Of course, the material of the second electrode 113 can also be aluminum/lithium fluoride, or silver.

Please refer to FIG. 2 again. The white-light producing layer 12 is disposed above the color-separating layer 13, and comprises a protecting medium, which is transparent and is doped with a fluorescent material and/or a phosphorescent material. The fluorescent material and/or the phosphorescent material of the white-light producing layer 12 can mix, scatter and excite the emitted from the organic light-emitting area 11, so as to translate the short wavelength light (ultraviolet light or blue light) emitted from the organic light-emitting area 11 into white light. Thus, the invention can enhance the luminescent efficiency of the organic light-emitting area 11. Therefore, the white light with uniform and broadband radiation spectrum can be obtained. Furthermore, the demands of the color display panel can be satisfied. Moreover, the white-light producing layer 12 is a planar structure with a single layer, which can also provide a planarization effect.

In this embodiment, the material of the protecting medium can be selected from but not limited to the group consisting of Polymethyl methacrylate (PMMA), tetrafluoroethylene resin, silicon resin, and silicon dioxide.

The protecting medium can be used to protect the first electrode 111 and the second electrode 113. Since the protecting medium is adhesive, it can be used to attach with a cover plate 15. In other words, it is unnecessary to apply a sealing glue, and the encapsulation process can still be performed. In addition, the protecting medium is waterproof. The protecting medium can combine with the cover plate 15 or the passivation layer of the organic light-emitting area 11 (not shown) to form an encapsulation. Thus, the organic light-emitting area 11 can be prevented from water or oxygen.

In the current embodiment, the fluorescent material can be produced by mixing red fluorescent powder, green fluorescent powder, and/or blue fluorescent powder. The phosphorescent material can be produced by mixing red phosphorescent powder, green phosphorescent powder, and/or blue phosphorescent powder.

As mentioned above, the fluorescent material may include more than one organic dyes or more than one inorganic dyes. Herein, the red fluorescent powder may be an azo dye (organic dye) or $Y_2O_2S:Eu^{3+}$, $Bi^{3+}$ (inorganic dye). The green fluorescent powder may be a CuPc dye (organic dye) or $SrGa_2O_4:Eu^{2+}$ (inorganic dye). The blue fluorescent powder may be a cyanine dye (organic dye) or $SrGa_2S_4:Eu^{2+}$ (inorganic dye). In this embodiment, the fluorescent material may be nano sized powder.

In addition, the phosphorescent material may include more than one organic dye or more than one inorganic dye. In the embodiment, the red phosphorescent powder may be 2,3,7,8,12,13,17,18-octaethyl-12H,23H-porphine platinum (II) [PtOEP] or Tris-(4,4,4-trifluoro-1-(2-thienyl)-1,3-butanediono)-1,10-phenanthroline europium(III) [Eu(TTA)3phen]. The green phosphorescent powder may be Bis(2-phenyl-pyridinato-N,C2)iridium(acetylacetone) [ppy2Ir(acac)] or Iridium(III) bis(tolypyridine) salicyclidene [tpyIrsd]. The blue phosphorescent powder may be Iridium-bis(4,6-di-fluorophenyl-pyridinato-N,C2)-picolinate [Firpic] or Bis[(4,6-difluorophenyl-pyridinato-N,C2)iridium (acetylacetone) [Fir(acac)]. In this embodiment, the phosphorescent material may be nano sized powder.

Figure 3:
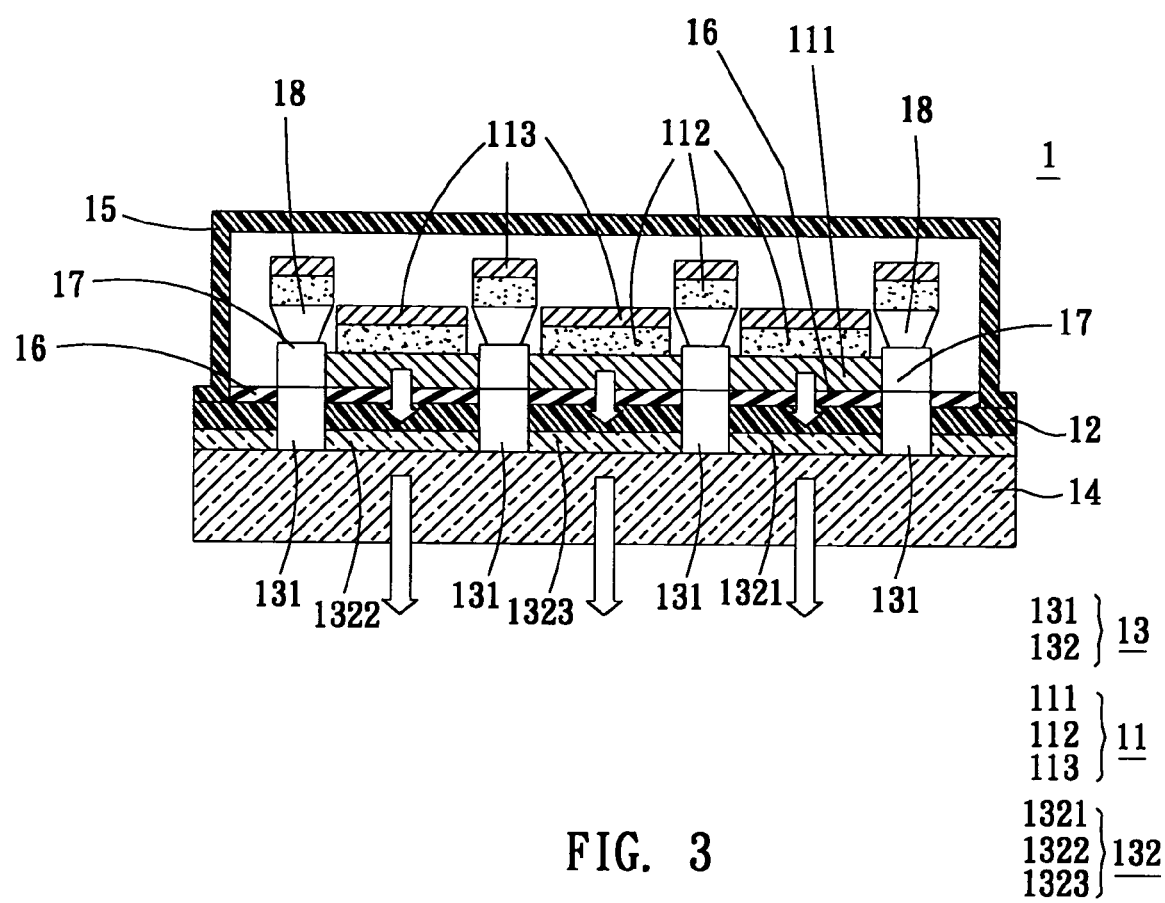
FIG. 3 is a schematic view showing another full color display panel according to the first embodiment of the invention.

Referring to FIG. 2, the color separating layer 13 comprises a plurality of color filters 132 surrounded with a light-shielding frame 131. Herein, the light-shielding frame 131 is a black frame, which can avoid the mixing of light of various colors. Of course, the light-shielding frame 131 can be made of reflective metal for controlling the direction of the light and increasing the utilization and uniformity of light. In addition, the light-shielding frame 131 can be configured higher than the color filters 1321, 1322, 1323 (as shown in FIG. 3).

The color filters 132 comprise at least one red filter 1321, at least one blue filter 1322, and at least one green filter 1323. In the current embodiment, the high purity white light produced by the white-light producing layer 12 respectively passes the red filters 1321, the blue filters 1322 and the green filters 1323, so as to produce red light, blue light and green light.

Please refer to FIG. 2 again. The transparent substrate 14 of the embodiment can be a flexible or rigid substrate. The transparent substrate 14 can also be a plastic or glass substrate. In particular, the flexible substrate or plastic substrate can be made of polycarbonate (PC), polyester (PET), cyclic olefin copolymer (COC), or metallocene-based cyclic olefin copolymer (mCOC).

As shown in FIG. 2, the full color display panel 1 of the embodiment may further comprise an insulating layer 16, which is disposed between the white-light producing layer 12 and the organic light-emitting area 11. Thus, the insulating layer 16 can prevent the substantially contact of the white-light producing layer 12 and the organic light-emitting area 11, which leads to short circuit. Herein, the insulating layer 16 is transparent and can be made of an organic compound or inorganic compound.

In addition, the full color display panel 1 of the embodiment may further comprise a pixel defining layer 17. The pixel defining layer 17 is disposed above the white-light producing layer 12 to define, pixels within the organic light-emitting area 11. The pixel defining layer 17 may be black to shield or reflect light. This could avoid mixing of the light emitted from the pixels, control the direction of the light, and increase the utilization and uniformity of light. In the embodiment, the light-shielding frame 131 protruded from the white-light producing layer 12 may connect to the pixel defining layer 17 (as shown in FIG. 3).

The full color display panel 1 of the embodiment may further comprise a separating layer 18, which is disposed on the pixel defining layer 17. The separating layer 18 can separate each pixel of the organic light-emitting area 11. In this case, the separating layer 18 is made of an insulating material and has a top width larger than a bottom width thereof.

Figure 4:
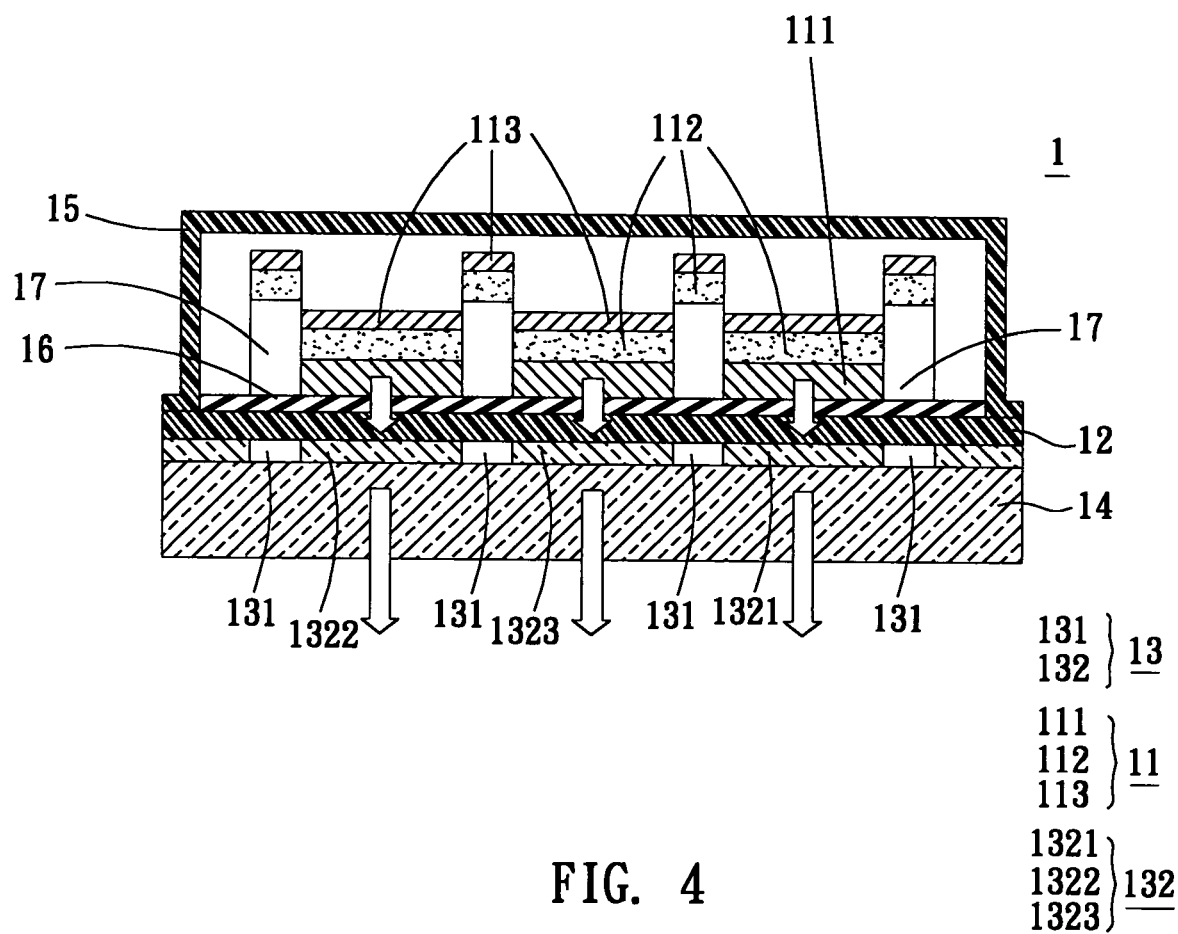
FIG. 4 is a schematic view showing yet another full color display panel according to the first embodiment of the invention.

In general, the separating layer 18 is provided in a passive matrix full color display panel, such as a PMOLED, to separate the cathodes of the pixels for simplifying manufacturing processes. In addition, an active matrix full color display panel, such as an AMOLED, has thin-film transistors (TFT) for controlling the pixels, so the separating layer 18 is unnecessary (as shown in FIG. 4).

Moreover, the full color display panel 1 of the embodiment may further comprise a driving circuit (not shown). The driving circuit can be an active driving circuit or a passive driving circuit. The driving circuit is connected to the organic light-emitting area 11 and a power source (not shown).

Figure 5A:
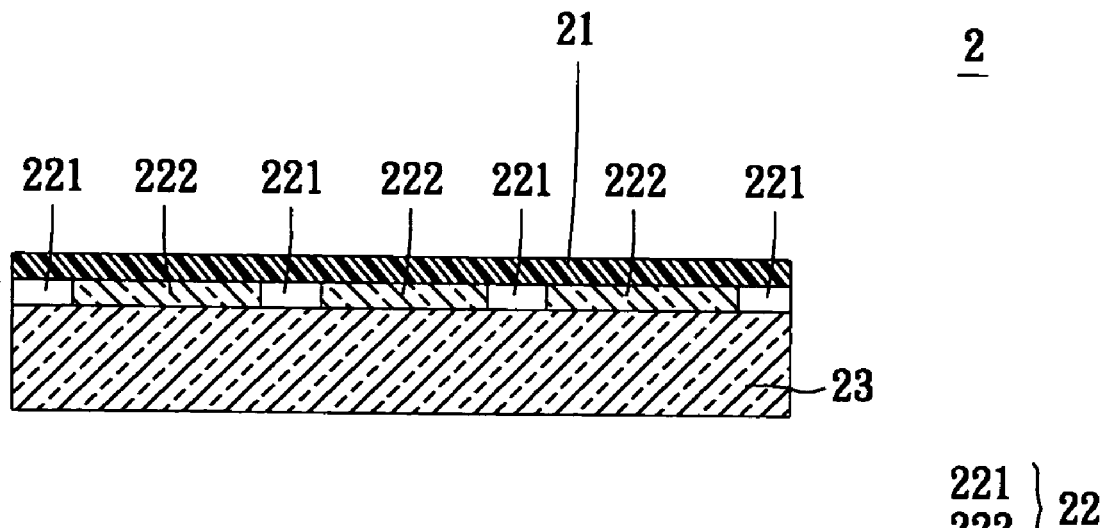
FIGS. 5A to 5C are a set of schematic views showing a color-separating substrate according to a second embodiment of the invention.

With reference to FIG. 5A, a color-separating substrate 2 according to a second embodiment of the invention comprises a white-light producing layer 21, a color-separating layer 22, and a transparent substrate 23. Herein, the white-light producing layer 21 comprises a transparent protecting medium doped with a fluorescent material and/or a phosphorescent material. The fluorescent material and/or the phosphorescent material can be excited by the short wavelength light and then emit white light. The color-separating layer 22 comprises a plurality of color filters 222 surrounded with a light-shielding frame 221. The color-separating layer 22 is disposed on the transparent substrate 23, and the white-light producing layer 21 is disposed above the color-separating layer 22.

Figure 5B:
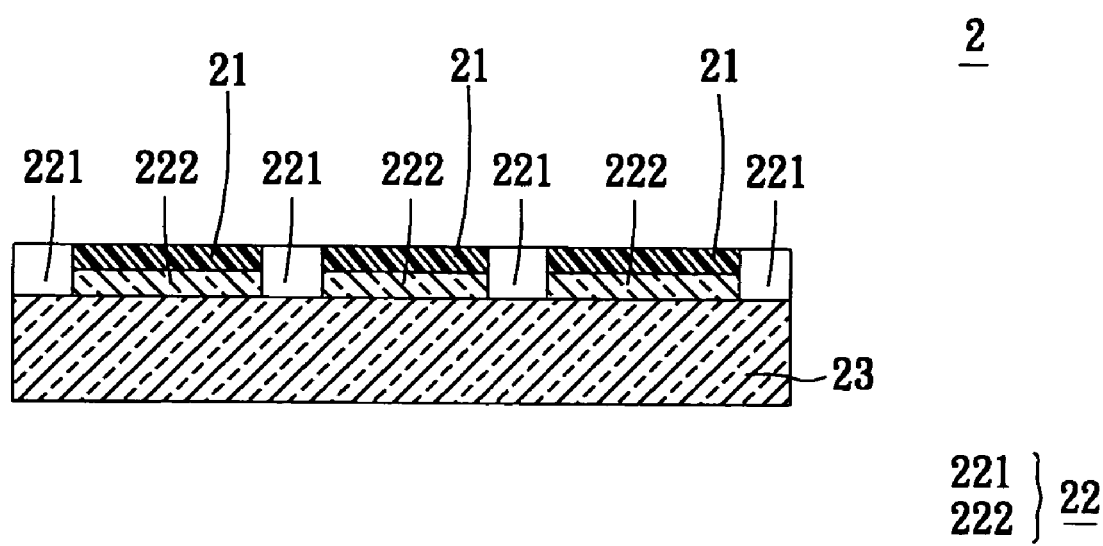
Figure 5C:
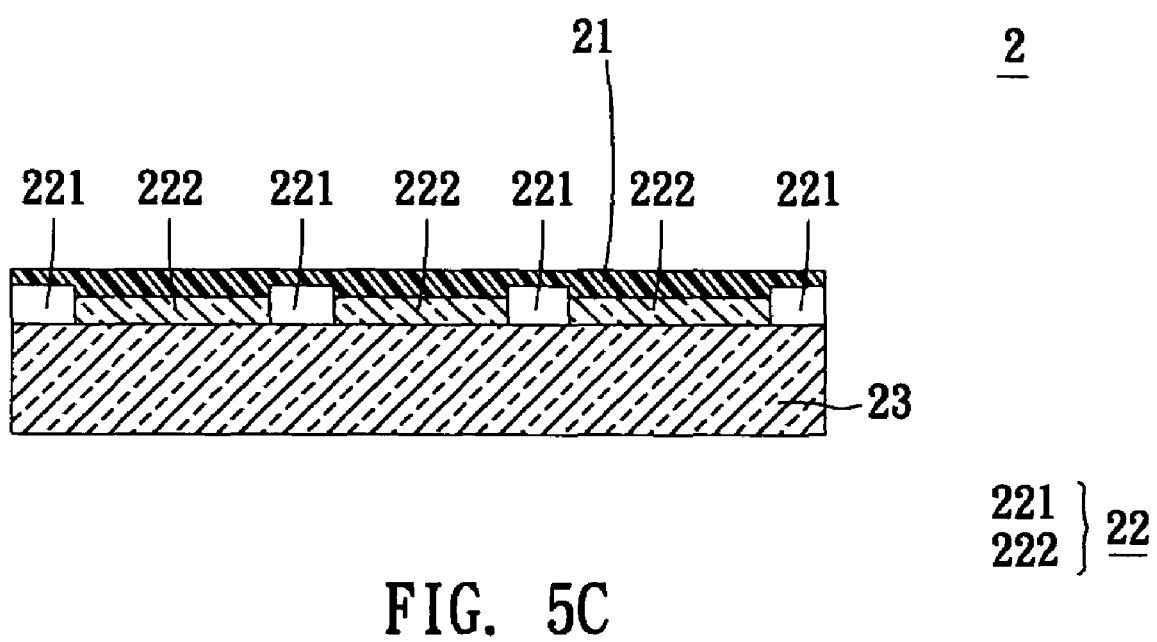

In addition, as shown in FIG. 5B and FIG. 5C, the light-shielding frame 221 may be configured higher than the color filters 1321, 1322, 1323.

Since the features and functions of the elements in the second embodiment are the same as those in the first embodiment, they are not repeatedly described hereinafter.

In brief, the full color display panel and color-separating substrate thereof of the invention has a white-light producing layer, which is used to translate the short wavelength ultraviolet or blue light into white light and to enhance the luminescent efficiency of the organic light-emitting area. Therefore, the white light with uniform and broadband radiation spectrum can be obtained, and satisfy the application of full color displays. Comparing with the conventional art, since the planarization layer is unnecessary in the invention, the structure of the full color display panel of the invention is simplified. At the meanwhile, the thickness of the panel of the invention is reduced. In addition, since it is unnecessary to perform the photolithography processes to form the color conversion films of three primary colors (R, G, B), the manufacturing processes of the full color display panel are simplified and the cost thereof is decreased, and the manufacturing yield is increased. Furthermore, since it is not to be restricted by the areas of the color conversion films, the viewing angle of the panel can be increased.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A full color display panel, comprising:
   an organic light-emitting area, which comprises a plurality of pixels for emitting short wavelength light;
   a white-light producing layer, which comprises a transparent protecting medium doped with a fluorescent material and/or a phosphorescent material, wherein the fluorescent material and/or the phosphorescent material is excited by short wavelength light to emit white light;

a color-separating layer, which comprises a plurality of color filters surrounded with a light-shielding frame; and a transparent substrate, wherein the color-separating layer is disposed on the transparent substrate, the white-light producing layer is disposed above the color-separating layer, and the organic light-emitting area is disposed above the white-light producing layer.

2. The full color display panel of claim 1, further comprising:

an insulating layer, which is disposed between the white-light producing layer and the organic light-emitting area.

3. The fall color display panel of claim 1, wherein the pixel comprises a first electrode, an organic functional layer, and a second electrode, the first electrode being disposed above the white-light producing layer, the second electrode being disposed above the first electrode, and the organic functional layer being disposed between the first electrode and the second electrode.

4. The full color display panel of claim 3 further comprising:

a pixel defining layer, which is disposed above the white-light producing layer to define pixels within the organic light-emitting area.

5. The full color display panel of claim 4, further comprising:

a separating layer, which is disposed on the pixel defining layer.

6. The full color display panel of claim 1, wherein the color filters are provided corresponding to the pixels of the organic light-emitting area.

7. The full color display panel of claim 1, wherein the material of the protecting medium is at least one selected from the group consisting of polymerthyl methacrylate, tetrafluoroethylene resin, silicon resin, and silicon dioxide.

8. The full color display panel of claim 1, wherein the protecting medium is adhesive or waterproof for attaching with a cover plate.

9. The full color display panel of claim 1, wherein the fluorescent material is mixed with red fluorescent powder, green fluorescent powder, and/or blue fluorescent powder, and the phosphorescent material is mixed with red phosphorescent powder, green phosphorescent powder, and/or blue phosphorescent powder.

10. The full color display panel of claim 1, wherein the light-shielding frame is configured higher than the color filters.

11. The full color display panel of claim 1, wherein the color filters comprise at least one red filter, at least one blue filter, and at least one green filter.

12. The full color display panel of claim 1, wherein the short wavelength light is ultraviolet light or blue light.

13. A color separating substrate, comprising:

a white-light producing layer, which comprises a transparent protecting medium doped with a fluorescent material and/or a phosphorescent material, wherein the fluorescent material and/or the phosphorescent material is excited by short wavelength light to emit white light;

a color-separating layer, which comprises a plurality of color filters surrounded with a light-shielding frame; and a transparent substrate, wherein the color-separating layer is disposed on the transparent substrate, the white-light producing layer is disposed above the color-separating layer.

14. The color separating substrate of claim 13, further comprising:

an insulating layer, which is disposed between the white-light producing layer.

15. The color separating substrate of claim 13, wherein the material of the protecting medium is at least one selected from the group consisting of polymerthyl methacrylate, tetrafluoroethylene resin, silicon resin, and silicon, dioxide.

16. The color separating substrate of claim 13, wherein the fluorescent material is mixed with red fluorescent powder, green fluorescent powder, and/or blue fluorescent powder, mid the phosphorescent material is mixed with red phosphorescent powder, green phosphorescent powder, and/or blue phosphorescent powder.

17. The color separating substrate of claim 13, wherein the light-shielding frame is configured higher than the color filters.

18. The color separating substrate of claim 13, wherein the color filters comprise at least one red filter, at least one blue filter, and at least one green filter.

19. The color separating substrate of claim 13, wherein the transparent substrate is at least one selected from the group consisting of flexible substrate, rigid substrate, plastic substrate and glass substrate.

20. The color separating substrate of claim 13, wherein the short wavelength light is ultraviolet light or blue light.

* * * * *